United States Patent
Ly et al.

(10) Patent No.: US 11,294,238 B1
(45) Date of Patent: Apr. 5, 2022

(54) LOW BLUE LIGHT BACKLIGHT MODULE

(71) Applicant: Lextar Electronics Corporation, Hsinchu (TW)

(72) Inventors: Kiet Tuong Ly, Hsinchu (TW); Fu-Hsin Chen, Hsinchu (TW); Yi-Ting Tsai, Hsinchu (TW); Hung-Chia Wang, Hsinchu (TW); Chia-Chun Hsieh, Hsinchu (TW); Hung-Chun Tong, Hsinchu (TW); Yu-Chun Lee, Hsinchu (TW); Tzong-Liang Tsai, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 17/083,328

(22) Filed: Oct. 29, 2020

(51) Int. Cl.
*H01L 33/50* (2010.01)
*G02F 1/13357* (2006.01)

(52) U.S. Cl.
CPC .. *G02F 1/133609* (2013.01); *G02F 1/133603* (2013.01); *H01L 33/502* (2013.01)

(58) Field of Classification Search
CPC ..................................................... H01L 33/502
USPC ......................................................... 362/97.1
See application file for complete search history.

(56) References Cited

U.S. PATENT DOCUMENTS

| | | | |
|---|---|---|---|
| 7,663,714 B2 | 2/2010 | Haga et al. | |
| 7,777,835 B2 | 8/2010 | Park et al. | |
| 8,040,041 B2 | 10/2011 | Hosokawa et al. | |
| 8,328,405 B2 | 12/2012 | Negley | |
| 9,087,968 B2 | 7/2015 | Lee et al. | |
| 9,496,464 B2 | 11/2016 | Yao et al. | |

(Continued)

FOREIGN PATENT DOCUMENTS

| | | |
|---|---|---|
| CN | 1225382 A | 8/1999 |
| CN | 1938870 A | 3/2007 |

(Continued)

OTHER PUBLICATIONS

Hom Nath Luitel and Takanori Watari, "Color Tunable Persistent Luminescence in M2MgSi2O7:Eu2+,Dy3+ (M=Ca,Sr,Ba) Phosphor With Controlled Microstructure", Journal of Applied Chemical Science International 7(2):76-83, 2016, p. 76-83, Nov. 12, 2016.

(Continued)

*Primary Examiner* — Christopher M Raabe
(74) *Attorney, Agent, or Firm* — CKC & Partners Co., LLC

(57) ABSTRACT

A low blue light backlight module configured to emit a white light is provided. The low blue light backlight module includes a first light-emitting element, a second light-emitting element, a third light-emitting element and a fourth light-emitting element. The first light-emitting element is configured to emit a first light having a peak emission wavelength of about 610-660 nm. The second light-emitting element is configured to emit a second light having a peak emission wavelength of about 520-550 nm. The third light-emitting element is configured to emit a third light having a peak emission wavelength of about 480-580 nm. The fourth light-emitting element is configured to emit a fourth light having a peak emission wavelength of about 445-470 nm. The white light has an emission spectrum, and an area ratio of the spectrum under wavelength of 415-455 nm to the spectrum under wavelength of 400-500 nm is below 50%.

18 Claims, 7 Drawing Sheets

(56) References Cited

U.S. PATENT DOCUMENTS

| | | |
|---|---|---|
| 9,590,149 B2 | 3/2017 | Lim et al. |
| 9,741,907 B2 | 8/2017 | Oh et al. |
| 9,804,436 B2 | 10/2017 | Yokota |
| 9,905,736 B2 | 2/2018 | Seki et al. |
| 9,923,126 B2 | 3/2018 | Kaneko et al. |
| 10,128,415 B2 | 11/2018 | Huang et al. |
| 10,177,287 B1 | 1/2019 | Melman et al. |
| 10,312,419 B2 | 6/2019 | Oh et al. |
| 10,468,563 B2 | 11/2019 | Yoshimura et al. |
| 2011/0050125 A1 | 3/2011 | Medendorp, Jr. et al. |
| 2011/0128718 A1* | 6/2011 | Ramer ............... F21V 3/12 362/84 |
| 2013/0070168 A1 | 3/2013 | Yokota et al. |
| 2013/0265744 A1 | 10/2013 | Park |
| 2016/0293811 A1 | 10/2016 | Hussell et al. |
| 2017/0047488 A1* | 2/2017 | Kaneko ............... H01L 33/62 |
| 2017/0082674 A1* | 3/2017 | Lawton ............... H02H 1/0015 |
| 2019/0254142 A1* | 8/2019 | Petluri ............... G09G 3/2003 |
| 2019/0317362 A1 | 10/2019 | Huang et al. |
| 2021/0060353 A1* | 3/2021 | Petluri ............... G09G 3/32 |

FOREIGN PATENT DOCUMENTS

| | | |
|---|---|---|
| CN | 101788737 A | 7/2010 |
| CN | 105051154 A | 11/2015 |
| CN | 102738369 B | 6/2016 |
| CN | 105788474 A | 7/2016 |
| CN | 109599471 A | 4/2019 |
| CN | 109860370 B | 10/2019 |
| CN | 110299440 A | 10/2019 |
| JP | 2015-061009 A | 3/2015 |
| JP | 5799212 B2 | 10/2015 |
| TW | 201102694 A1 | 1/2011 |
| TW | 201708503 A | 3/2017 |
| TW | I580004 B | 4/2017 |

OTHER PUBLICATIONS

Chiu, Chuang-Hung, The Synthesis and Luminescence Characterization of UV-LED Convertible Phosphors for Lighting Applications, 2003.

* cited by examiner

LOW BLUE LIGHT BACKLIGHT MODULE

BACKGROUND

Field of Invention

The present invention relates to a low blue light backlight module.

Description of Related Art

Liquid crystal display (LCD) and light-emitting diode (LED) display devices have gradually become popular in the past ten years, and people can enjoy light sources with higher quality and higher energy conversion efficiency. Various improvements to display technology have also sprung up recently. In various sub-fields of display technologies, the improvement of human eye protection is an important trend. Light-emitting diodes currently used as light sources are made of blue light-emitting diodes with a wavelength of about 450 nm, which are converted into white light by light conversion materials and are used as light sources for displays. However, studies have pointed out that blue light with a wavelength between about 415 nm and about 455 nm is more harmful to the eyes, and can easily cause various diseases such as macular degeneration. Therefore, in recent years, a low blue light indicator which helps protect the eyes of users has been proposed.

At present, the products in the market that reduce blue light with the wavelength range that hurts the eyes are mostly performed by reducing the intensity of blue light and using long-wavelength blue light. Change in intensity distribution of various wavelengths emitted by the display device are mainly through software programs, or through specially designed filters to filter out blue light, so as to reduce the intensity of blue light received by the human eyes.

Although the above method can protect the eyes, however, it also causes color distortion and makes the overall display effect felt by the users become worse, which decreases user experience.

SUMMARY

In accordance with an aspect of the present invention, a low blue light backlight module configured to emit a white light is provided. The low blue light backlight module configured to emit a white light includes a first light-emitting element, a second light-emitting element, a third light-emitting element and a fourth light-emitting element. The first light-emitting element is configured to emit a first light having a peak emission wavelength of about 610-660 nm. The second light-emitting element is configured to emit a second light having a peak emission wavelength of about 520-550 nm. The third light-emitting element is configured to emit a third light having a peak emission wavelength of about 480-580 nm. The fourth light-emitting element is configured to emit a fourth light having a peak emission wavelength of about 445-470 nm. The white light has an emission spectrum, and an area ratio of the spectrum under wavelength of 415-455 nm to the spectrum under wavelength of 400-500 nm is below 50%.

According to some embodiments of the present invention, the first light-emitting element includes a first light-emitting unit and a first wavelength conversion unit.

According to some embodiments of the present invention, the first light-emitting element includes a red LED chip.

According to some embodiments of the present invention, the second light-emitting element includes a second light-emitting unit and a second wavelength conversion unit.

According to some embodiments of the present invention, the second light-emitting unit includes a wavelength conversion material having a peak emission wavelength of 510-530 nm and a full width at half maximum (FWHM) of about 60-100 nm.

According to some embodiments of the present invention, the second light-emitting element includes a green LED chip.

According to some embodiments of the present invention, the third light-emitting element includes a third light-emitting unit and a third wavelength conversion unit.

According to some embodiments of the present invention, the third wavelength conversion unit includes a wavelength conversion material having a peak emission wavelength of 520-540 nm and a full width at half maximum (FWHM) of less than 50 nm.

According to some embodiments of the present invention, the wavelength conversion material includes green quantum dots.

According to some embodiments of the present invention, the third wavelength conversion unit includes a wavelength conversion material having a general formula (1) and satisfying a condition (2). The general formula (1) is $M_mA_aC_cE_e$:$ES_xRE_y$, M is at least one element selected from a group consisting of Ca, Sr and Ba, wherein $2 \leq m \leq 3$; A is at least one element selected from a group consisting of Mg, Mn, Zn and Cd, wherein $0.01 \leq a \leq 1$; C is at least one element selected from a group consisting of Si, Ge, Ti and Hf, wherein $1 \leq c \leq 9$; E is at least one element selected from a group consisting of O, S and Se, wherein $5 \leq e \leq 7$; ES is at least one element selected from a group consisting of divalent Eu, Sm and Yb, wherein $0 \leq x \leq 3$; and RE is at least one element selected from a group consisting of trivalent Ce, Pr, Nd, Sm, Eu, Gd, Tb, Dy, Ho, Er and Tm, wherein $0 \leq y \leq 3$. The condition (2) is m+x+y=3.

According to some embodiments of the present invention, the third wavelength conversion unit further complying with a condition (3), wherein the condition (3) is that the third light has a maximum intensity, a difference between a maximum wavelength $\lambda_{1\ max}$ and a minimum wavelength $\lambda_{1\ min}$ of the third light is a' when an intensity of the third light is 50% of the maximum intensity, and another difference between a maximum wavelength $\lambda_{2\ max}$ and a minimum wavelength $\lambda_{2\ min}$ of the third light is b' when an intensity of the third light is 10% of the maximum intensity, wherein $2.5a' \leq b' \leq 7a'$.

According to some embodiments of the present invention, $30\ nm \leq a' \leq 50\ nm$.

According to some embodiments of the present invention, the fourth light-emitting element includes a blue LED chip.

According to some embodiments of the present invention, the first light-emitting element, the second light-emitting element, the third light-emitting element and the fourth light-emitting element are arranged in an array or in a row.

According to some embodiments of the present invention, the low blue light backlight module further includes an encapsulant between the first light-emitting element, the second light-emitting element, the third light-emitting element and the fourth light-emitting element.

According to some embodiments of the present invention, an area ratio of the spectrum under wavelength of 415-455 nm to the spectrum under wavelength of 380-780 nm is below 30%.

According to some embodiments of the present invention, the white light has an emission spectrum with a color gamut of at least 90% of NTSC RGB color space standard.

According to some embodiments of the present invention, the low blue light backlight module further includes a reflective structure located between the first light-emitting element, the second light-emitting element, the third light-emitting element and the fourth light-emitting element.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
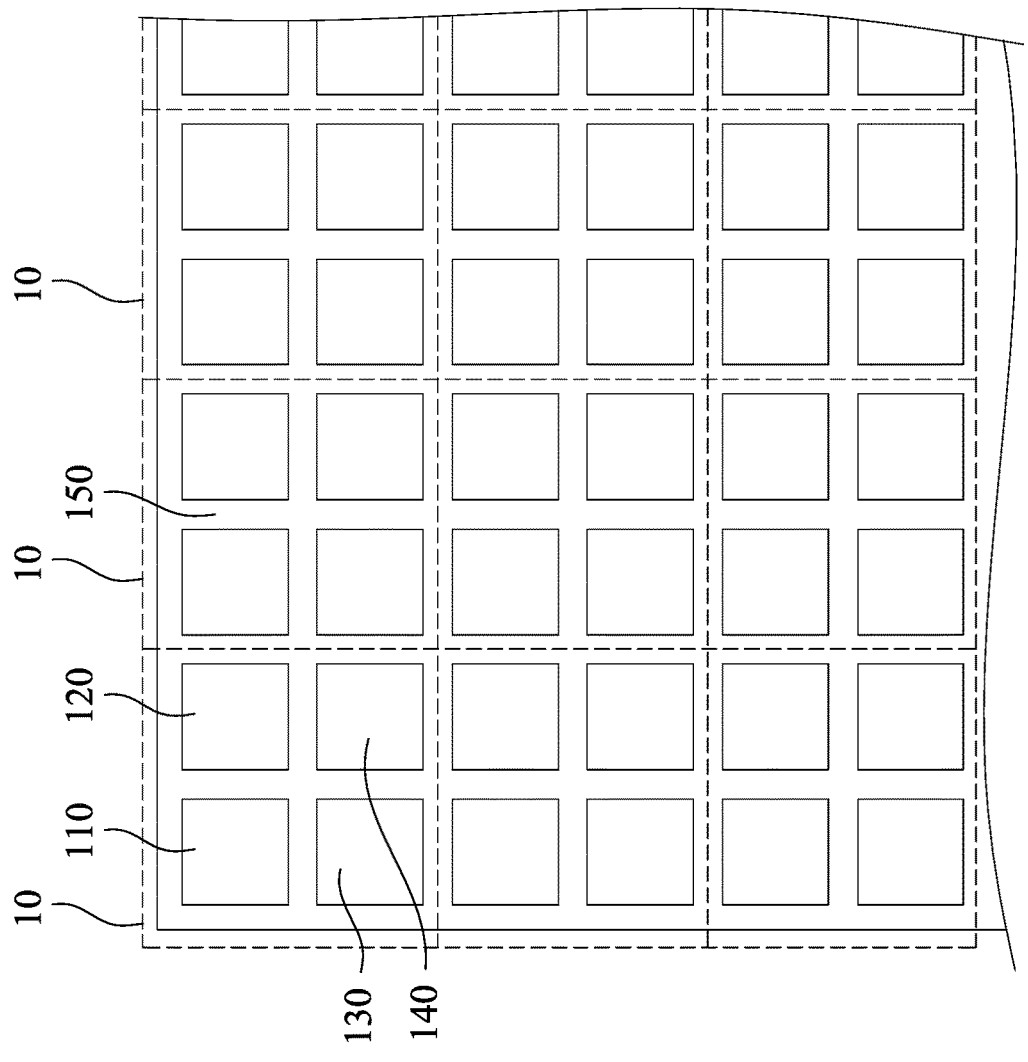
FIG. 1 is a top view illustrating a low blue light backlight module in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

FIG. 1 is a top view illustrating a low blue light backlight module 1000 in accordance with some embodiments of the present disclosure. Reference is made to FIG. 1. The low blue light backlight module 1000 configured to emit a white light includes a first light-emitting element 110, a second light-emitting element 120, a third light-emitting element 130 and a fourth light-emitting element 140. The first light-emitting element 110 is configured to emit a first light having a peak emission wavelength of about 610-660 nm. The second light-emitting element 120 is configured to emit a second light having a peak emission wavelength of about 520-550 nm. The third light-emitting element 130 is configured to emit a third light having a peak emission wavelength of about 480-580 nm. The fourth light-emitting element 140 is configured to emit a fourth light having a peak emission wavelength of about 445-470 nm. Further, the first light-emitting element 110, the second light-emitting element 120, the third light-emitting element 130 and the fourth light-emitting element 140 are taken together as a unit 10 and repeatedly arranged within the low blue light backlight module 1000.

Figure 2:
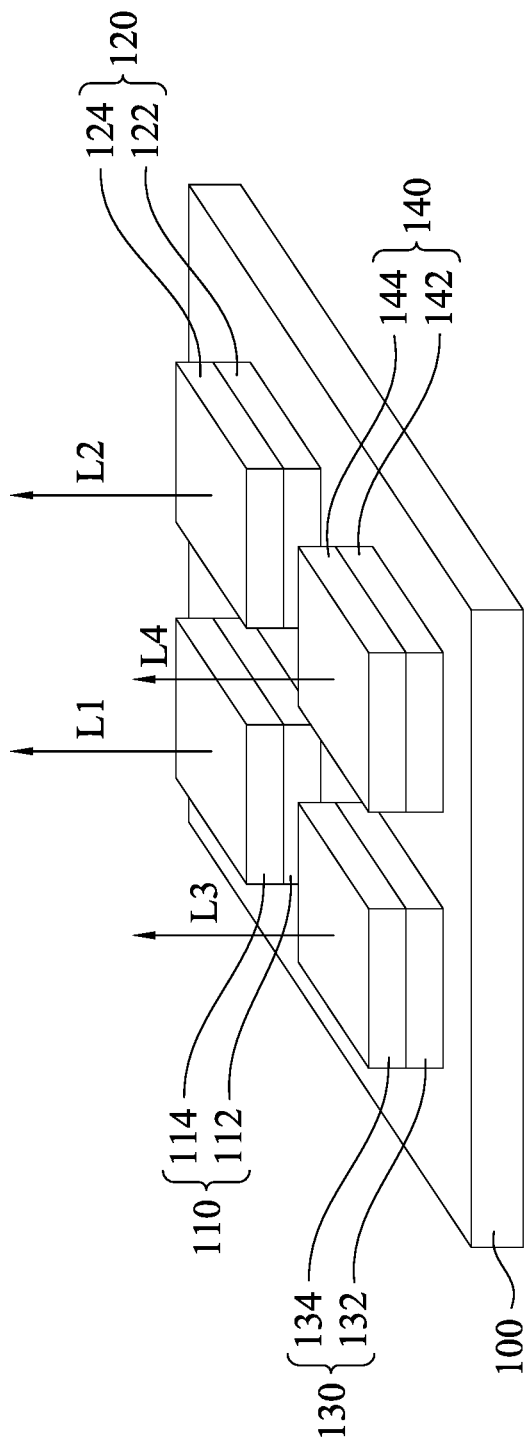
FIG. 2 is an enlarged diagram of the low blue light backlight module in FIG. 1.
Figure 3:
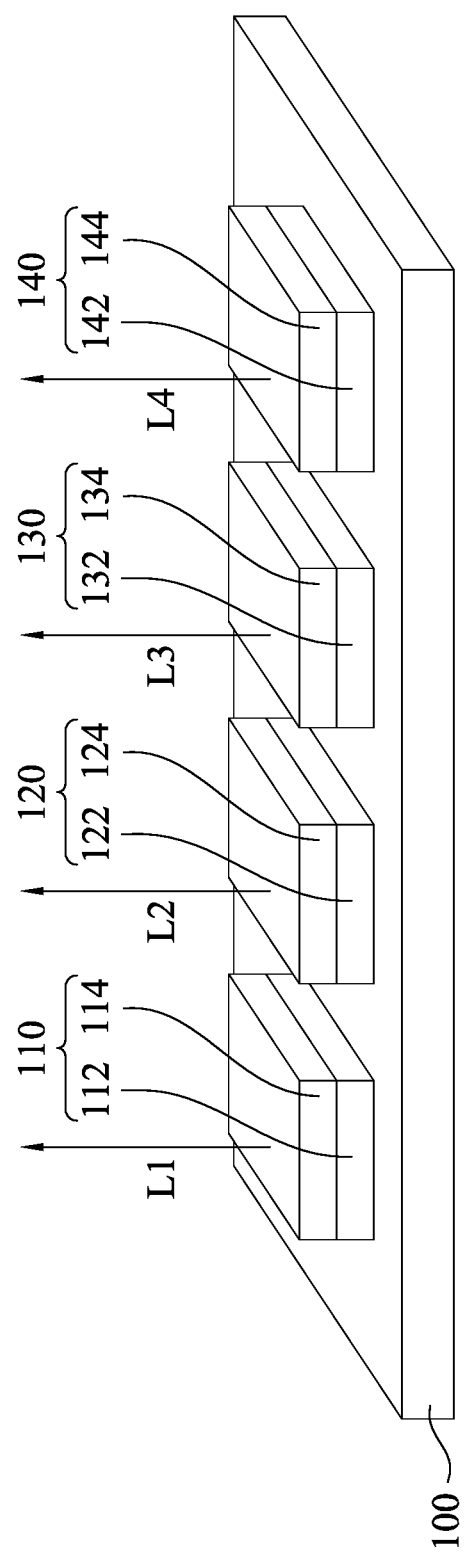
FIG. 3 is an enlarged diagram of the low blue light backlight module in FIG. 1.

FIG. 2 is an enlarged diagram of the low blue light backlight module in FIG. 1. As shown in FIG. 2, the first light-emitting element 110, the second light-emitting element 120, the third light-emitting element 130 and the fourth light-emitting element 140 are arranged in a 2×2 array on a substrate 100. In other embodiments, the first light-emitting element 110, the second light-emitting element 120, the third light-emitting element 130 and the fourth light-emitting element 140 are arranged in one row on the substrate 100, as shown in FIG. 3 and repeatedly arranged within the low blue light backlight module 1000. It is noted that the arrangement of the first light-emitting element 110, the second light-emitting element 120, the third light-emitting element 130 and the fourth light-emitting element 140 shown in FIG. 1 to FIG. 3 are only an example, and is not intended to limit the scope of the present disclosure. For example, the fourth light-emitting element 140 may be adjacent to the first light-emitting element 110. The low blue light backlight module 1000 may optionally include other elements, which are described hereinafter.

Reference is made to FIG. 2 and FIG. 3. The first light-emitting element 110 is configured to emit a first light L1 having a peak emission wavelength of about 610-660 nm. In some embodiments, the first light-emitting element 110 includes a first light-emitting unit 112 and a first wavelength conversion unit 114 disposed thereon, as shown in FIG. 2 and FIG. 3. The first light-emitting unit 112 may be a blue LED chip configured to emit a blue light having a peak emission wavelength of about 445 nm-470 nm. The first wavelength conversion unit 114 may include a first wavelength conversion material configured to convert the blue light emitted from the first light-emitting unit 112 to generate the first light L1 (i.e., red light). The first wavelength conversion material includes red-emitting phosphor powder and/or red-emitting quantum dots. In some example, the red-emitting phosphor may be nitride phosphor powder ($(Sr,Ca)AlSiN_3$:Eu, $Ca_2Si_5N_8$:$Eu^{2+}$, and $Sr(LiAl_3N_4)$:$Eu^{2+}$) and/or manganese-doped red fluoride phosphor powder ($K_2GeF_6$:$Mn^{4+}$, $K_2SiF_6$:$Mn^{4+}$, and $K_2TiF_6$:$Mn^{4+}$), but is not limited thereto. In other example, the red-emitting quantum dots may be indium phosphide (InP) quantum dots, cadmium selenide (CdSe) quantum dots, and/or all-inorganic perovskite quantum dots having a general formula: $CsPb(Br_{1-c}I_c)_3$ and $0.5 \leq c' \leq 1$, but is not limited thereto. In other embodiments, the first light-emitting element 110 is a red LED chip for emitting a first light L1 having a peak emission wavelength of about 610-660 nm.

Figure 4:
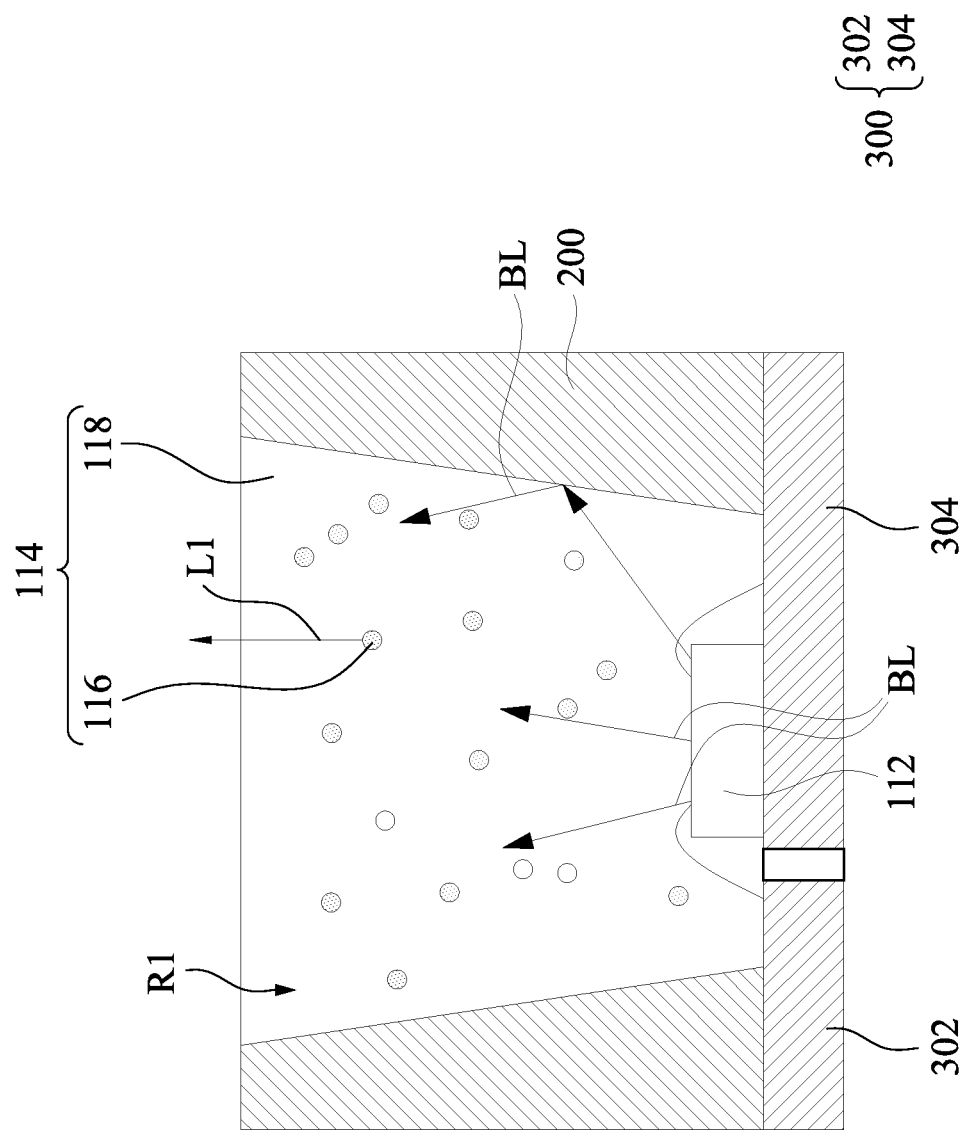
FIG. 4 is a cross-section view illustrating a light-emitting element in accordance with some embodiments of the present disclosure.

Reference is made to FIG. 4. FIG. 4 is a cross-section view illustrating a first light-emitting element 110 in accordance with other embodiments of the present disclosure. The first light-emitting element 110 includes a lead frame 300 having two electric leads 302 and 304, a side wall 200 defining a recess R1 on the lead frame 300, a first light-emitting unit 112 in the recess R1 surrounded by the side wall 200 and electrically connected to two electric leads 302 and 304 of the lead frame 300, and a first wavelength conversion unit 114 covering the first light-emitting unit 112 in the recess R1. The first light-emitting unit 112 may be a blue LED chip configured to emit a blue light BL having a peak emission wavelength of about 445 nm-470 nm. The first wavelength conversion unit 114 may include a first wavelength conversion material 116 distributed along a light exit path of the first light-emitting unit 112 in a form of particles. The first wavelength conversion material 116 is configured to convert the blue light BL emitted from the first light-emitting unit 112 to generate the first light L1 (i.e., red light). In some embodiments, the first wavelength conversion material 116 includes red-emitting phosphor powder and/or red-emitting quantum dots. In some example, the red-emitting phosphor may be nitride phosphor powder ((Sr,Ca)AlSiN$_3$:Eu, Ca$_2$Si$_5$N$_8$:Eu$^{2+}$, and Sr(LiAl$_3$N$_4$):Eu$^{2+}$) and/or manganese-doped red fluoride phosphor powder (K$_2$GeF$_6$:Mn$^{4+}$, K$_2$SiF$_6$:Mn$^{4+}$, and K$_2$TiF$_6$:Mn$^{4+}$), but is not limited thereto. In other example, the red-emitting quantum dots may be indium phosphide (InP) quantum dots, cadmium selenide (CdSe) quantum dots, and/or all-inorganic perovskite quantum dots having a general formula: CsPb(Br$_{1-c'}$I$_{c'}$)$_3$ and 0.5≤c'≤1, but is not limited thereto. The side wall 200 guides a direction of output light path.

In some embodiments, the first light-emitting element 110 further includes a filling material 118 mixed with the first wavelength conversion material 116. The filling material 118 may be configured to improve or adjust a light output efficiency of the first light-emitting element 110 by refractive index matching. It is noted that the content of this paragraph is only an example of possibilities of some applications, and is not intended to limit the scope of the present disclosure.

Referring to FIG. 2 and FIG. 3. The second light-emitting element 120 is configured to emit a second light L2 having a peak emission wavelength of about 520-550 nm. In some embodiments, the second light-emitting element 120 includes a second light-emitting unit 122 and a second wavelength conversion unit 124 disposed thereon, as shown in FIG. 2 and FIG. 3. In some embodiments, the second light-emitting element 120 has a structure similar to the first light-emitting element 110 shown in FIG. 4. The second light-emitting unit 122 may be a blue LED chip configured to emit a blue light having a peak emission wavelength of about 445 nm-470 nm. The second wavelength conversion unit 124 may include a second wavelength conversion material in a form of particles. The second wavelength conversion material is configured to convert the blue light emitted from the second light-emitting unit 122 to generate the second light L2 (i.e., green light). In some embodiments, the second wavelength conversion material has a peak emission wavelength of 510-530 nm and a full width at half maximum (FWHM) of about 60-100 nm. In other embodiments, the second light-emitting element 120 includes a green LED chip for emitting a second light L2 having a peak emission wavelength of about 520-550 nm.

In some embodiments, the second wavelength conversion material may include green-emitting phosphor powder. In some examples, the green-emitting phosphor powder may be lutetium aluminum garnet (LuAG) phosphor powder, YAG phosphor powder, β-SiAlON phosphor powder, and/or silicate phosphor powder, but is not limited thereto.

The third light-emitting element 130 is configured to emit a third light L3 having a peak emission wavelength of about 480-580 nm. In some embodiments, the third light-emitting element 130 includes a third light-emitting unit 132 and a third wavelength conversion unit 134 disposed thereon, as shown in FIG. 2 and FIG. 3. In some embodiments, the third light-emitting element 130 has a structure similar to the first light-emitting element 110 shown in FIG. 4. The third light-emitting unit 132 may be a blue LED chip configured to emit a blue light having a peak emission wavelength of about 445 nm-470 nm. The third wavelength conversion unit 134 may include a third wavelength conversion material in a form of particles. The third wavelength conversion material is configured to convert the blue light emitted from the third light-emitting unit 132 to generate the third light L3 (i.e., low blue light). In some embodiments, the third wavelength conversion material has a peak emission wavelength of 520-540 nm and a full width at half maximum (FWHM) of less than 50 nm.

In some embodiments, the third wavelength conversion material includes a general formula (1) below and satisfying the following condition (2). The general formula (1) is $M_m A_a C_c E_e :ES_x RE_y$. In the general formula (1), "M" is at least one element selected from a group consisting of Ca, Sr and Ba, wherein 2≤m≤3. "A" is at least one element selected from a group consisting of Mg, Mn, Zn and Cd, wherein 0.01≤a≤1. "C" is at least one element selected from a group consisting of Si, Ge, Ti and Hf, in which 1≤c≤9. "E" is at least one element selected from a group consisting of O, S and Se, wherein 5≤e≤7. "ES" is at least one element selected from a group consisting of divalent Eu, Sm and Yb, in which 0≤x≤3. "RE" is at least one element selected from a group consisting of trivalent Ce, Pr, Nd, Sm, Eu, Gd, Tb, Dy, Ho, Er and Tm, in which 0≤y≤3. The condition (2) is m+x+y=3. For example, a group consisting of divalent Eu, Sm, and Yb refers to a group consisting of Eu$^{2+}$, Sm$^{2+}$, and Yb$^{2+}$. A group consisting of trivalent Ce, Pr, Nd, Sm, Eu, Gd, Tb, Dy, Ho, Er, and Tm refers to a group consisting of Ce$^{3+}$, Pr$^{3+}$, Nd$^{3+}$, Sm$^{3+}$, Eu$^{3+}$, Gd$^{3+}$, Tb$^{3+}$, Dy$^{3+}$, Ho$^{3+}$, Er$^{3+}$, and Tm$^{3+}$. The composition and the proportion of the third wavelength conversion material can be adjusted to control wavelength and color purity of the third light emitted by the excited third wavelength conversion material. Therefore, the wavelength of the third light emitted by the third wavelength conversion material in the present disclosure can be changed.

Figure 5:
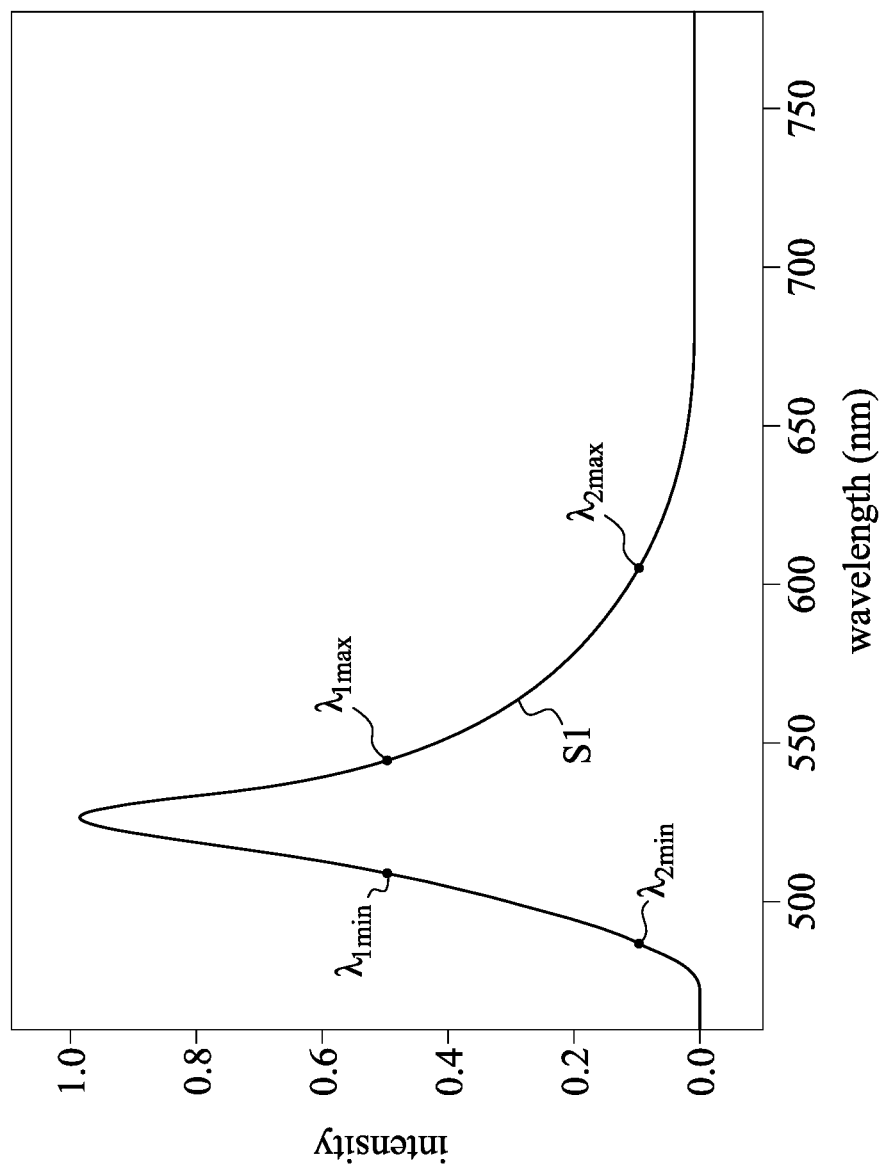
FIG. 5 is an excitation spectrum diagram of a wavelength conversion material in accordance with some embodiments of the present disclosure.

Reference is made to FIG. 5. FIG. 5 is an excitation spectrum diagram of a wavelength conversion material in accordance with some embodiments of the present disclosure. The curve S1 is the excitation spectrum of the third light L3. The horizontal axis in the FIG. 5 represents wavelength of the third light L3. The vertical axis in the FIG. 5 represents intensity of the third light L3 (1.0 represents a maximum light intensity). In some embodiments, the third wavelength conversion material is configured to be excited by the blue light having a peak emission wavelength of about 445 nm-470 nm to emit the third light L3 (low blue light) having a peak wavelength ranging from about 480 nm to about 580 nm, in which a preferred peak wavelength of the third light L3 ranges from about 520 nm to about 540 nm. The blue light may be emitted by a blue light-emitting diode, but is not limited thereto. Moreover, a difference between a maximum length $\lambda_{1\ max}$ and a minimum length $\lambda_{1\ min}$ of the third wavelength conversion material is small when the intensity of the third light is 50% of the maximum intensity, so that the third wavelength conversion material has good lumen efficacy and the third light emitted thereof has outstanding color purity.

In some embodiments, the third wavelength conversion material as mentioned further complies with a condition (3). The condition (3) is that the third light L3 has a maximum intensity, a difference between a maximum wavelength $\lambda_{1\ max}$ and a minimum wavelength $\lambda_{1\ min}$ of the third light L3 is a' when an intensity of the third light L3 is 50% of the maximum intensity, and another difference between a maximum wavelength $\lambda_{2\ max}$ and a minimum wavelength $\lambda_{2\ max}$ of the third light L3 is b' when an intensity of the third light L3 is 10% of the maximum intensity, wherein 2.5a'≤b'≤7a'. Therefore, differences between maximum intensities and minimum intensities of the green light in different intensities are small. Moreover, a' represents a full wave half maximum (FWHM), in which 30 nm≤a'≤50 nm, and thus the third light L3 emitted by the third wavelength conversion material of the present disclosure has a narrow FWHM. It can be known that the third wavelength conversion material has good lumen efficacy and the third light L3 emitted thereof has high color purity. In some embodiments, the third wavelength conversion material has a polycrystalline structure and includes at least one polycrystalline phase.

In other examples, the third wavelength conversion material includes green-emitting quantum dots having a peak emission wavelength of 520-540 nm and a full width at half maximum (FWHM) of less than 50 nm. Quantum dots may be CdSe quantum dots, cadmium sulfide (CdS) quantum dots, cadmium telluride (CdTe) quantum dots, InP quantum dots, indium nitride (InN) quantum dots, indium aluminum nitride (AlInN) quantum dots, indium gallium nitride (InGaN) quantum dots, aluminum gallium nitride (AlGaInN) quantum dots, copper indium gallium selenide (CuInGaSe) quantum dots, and all-inorganic perovskite quantum dots having a general formula: $CsPb(Br_{1-d'}I_{d'})_3$ and 0≤d'<0.5, but is not limited thereto.

Referring back to FIG. 2 and FIG. 3. The fourth light-emitting element 140 is configured to emit a fourth light having a peak emission wavelength of about 445-470 nm. In some embodiments, the fourth light-emitting element 140 includes a fourth light-emitting unit 142 and a transparent layer 144 disposed thereon. In some embodiments, the fourth light-emitting element 140 has a structure similar to the first light-emitting element 110 shown in FIG. 4. In some example, the difference between the fourth light-emitting element 140 and the first light-emitting element 110 is that the transparent layer 144 covering the fourth light-emitting unit 142 has no wavelength conversion material therein. The fourth light-emitting unit 142 may be a blue LED chip configured to emit a blue light having a peak emission wavelength of about 445 nm-470 nm.

Referring back to FIG. 1. In some embodiments, the low blue light backlight module 1000 further includes an encapsulant 150 disposed between the first light-emitting element 110, the second light-emitting element 120, the third light-emitting element 130 and the fourth light-emitting element 140. In some embodiments, the encapsulant 150 includes epoxy, silicone, resin, or the like. The encapsulant 150 may include be black encapsulant or white encapsulant, but is not limited thereto. In some examples, the black encapsulant includes a plurality of light-absorbing particles distributed therein. In some examples, the white encapsulant includes nanoparticles, such as $TiO_2$ distributed therein. The encapsulant 150 surrounding the first light-emitting element 110, the second light-emitting element 120, the third light-emitting element 130 and the fourth light-emitting element 140 can improve luminescent properties such as brightness or luminance of the of the low blue light backlight module 1000. In some embodiments, the low blue light backlight module 1000 further includes a reflective structure (not shown) located between the first light-emitting element 110, the second light-emitting element 120, the third light-emitting element 130 and the fourth light-emitting element 140. In some examples, the reflective structure may be disposed in the encapsulant 150. For clarify, the encapsulant 150 is not shown in FIG. 2 and FIG. 3. The reflective structure is such as a white matrix. In some embodiments, the low blue light backlight module 1000 further includes a black matrix (not shown) located between the first light-emitting element 110, the second light-emitting element 120, the third light-emitting element 130 and the fourth light-emitting element 140.

In some embodiments, the low blue light backlight module 1000 may be disposed in a Liquid-Crystal Display (LCD) to provide a backlight source. The low blue light backlight module 1000 emits a white light by mixing the first light L1, the second light L2, the third light L3 and the fourth light L4. The white light emitted from the low blue light backlight module 1000 simultaneously has a spectral characteristic of less than 50% of TUV Rheinland and more than 90% of wide color gamut (e.g., NTSC or DCI-P3, official names will be described later). Specifically, the white light emitted from the low blue light backlight module 1000 has an emission spectrum, and an area ratio of the spectrum under wavelength of 415-455 nm to the spectrum under wavelength of 400-500 nm is below 50%. Further, an area ratio of the spectrum under wavelength of 415-455 nm to the spectrum under wavelength of 380-780 nm is below 30%.

Figure 6:
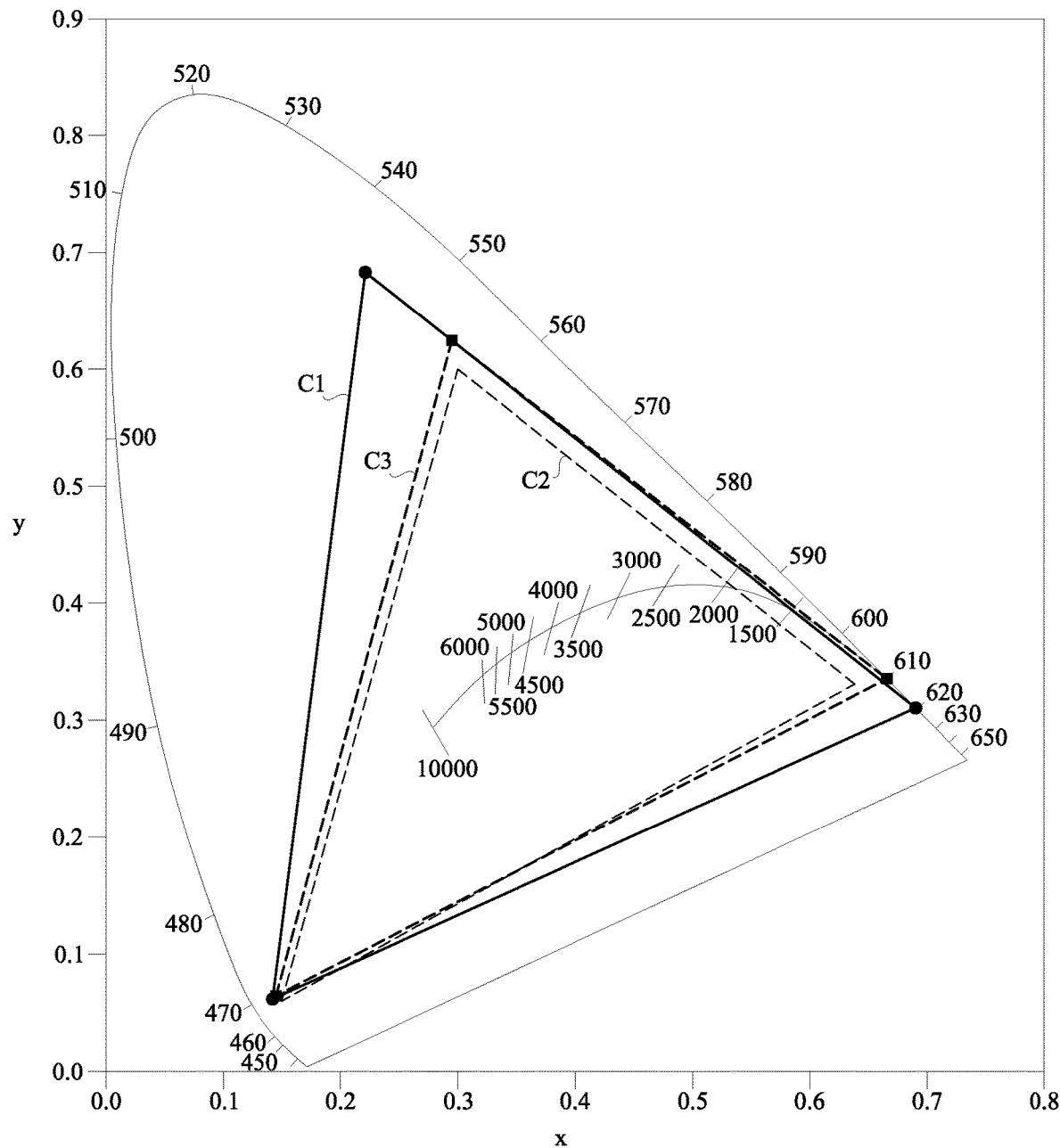
FIG. 6 is a comparative diagram among the color gamut distribution characteristics in some embodiments of the present disclosure and the color gamut standard and also the existing low blue light technology.

Reference is made to FIG. 6, which is related to the embodiments of the present disclosure that maintain a sufficiently wide coverage in the color gamut standard. FIG. 6 is a comparative diagram among the color gamut distribution characteristics in some embodiments of the present disclosure, the color gamut standard, and also the existing low blue light technology. The expression in FIG. 6 is the chromaticity coordinate system of the International Commission on Illumination (CEI), that is, the common CIE1931 chromaticity coordinate diagram. Briefly, in this coordinate diagram, it is red when x is greater than 0.6, and it is green when y is greater than 0.6. Since the aforementioned CIE1931 chromaticity coordinate diagram is a standard coordinate diagram which is commonly used. Therefore, introductions on the principle of the chromaticity coordinate diagram and meanings of numerical values on the coordinate are omitted here.

Reference is still made to FIG. 6. A first color gamut range C1 corresponding to the embodiments of the present disclosure is capable of completely covering a second color gamut range C2 which is covered by the standard Red Green Blue (sRGB) space. Furthermore, the embodiments of the present disclosure is capable of completely covering a third color gamut range C3 covered by a color gamut range of an existing liquid crystal display (LCD). The comparison presented in FIG. 6 shows that the first color gamut range C1 covered by the embodiments of the present disclosure at least has color gamut coverage equal to or greater than that of existing technologies.

In one exemplary embodiment, the first light-emitting unit 112, the second light-emitting unit 122, the third light-emitting unit 132 and the fourth light-emitting unit 142 of the low blue light backlight module 1000 are blue LED chips having a peak emission wavelength of about 450 nm. Under the above conditions, the white light simultaneously has a spectral characteristic of less than 50% of TUV Rheinland and more than 90% of Wide Color Gamut National Television System Committee (WCG-NTSC) or Digital Cinema Initiatives P3 (DCI-P3). That is, a proportion of a first spectral area of the white light in a wavelength range between 415 nm and 455 nm to a second spectral area of the white light in a wavelength range between 400 nm and 500 nm (i.e., TUV standard) is less than 50%. In addition, a proportion of the first spectral area to a third spectral area of the white light in a wavelength range between 380 nm and 780 nm is less than 30%. The "spectral area" referred to herein is an area enclosed by a spectral curve drawn in a coordinate in which a horizontal axis is the wavelength and a vertical axis is the light intensity. The spectral curve itself is regarded as an upper boundary of the vertical axis, and zero point of the vertical axis (i.e., horizontal axis) is regarded as a lower boundary of the vertical axis. The area represents the overall light intensity of the wavelength range of interest (which is incident into the eyes). The foregoing proportions show that these specific embodiments can simultaneously achieve the effects of wide color gamut and reducing the blue light that hurts the eyes.

In another exemplary embodiment, the first light-emitting unit 112, the second light-emitting unit 122, the third light-emitting unit 132 and the fourth light-emitting unit 142 of the low blue light backlight module 1000 are blue LED chips having a peak emission wavelength of about 460 nm. Under the above conditions, the white light simultaneously has a spectral characteristic of less than 20% of TUV Rheinland and more than 90% of Wide Color Gamut National Television System Committee (WCG-NTSC) or Digital Cinema Initiatives P3 (DCI-P3). That is, a proportion of a first spectral area of the white light in a wavelength range between 415 nm and 455 nm to a second spectral area of the white light in a wavelength range between 400 nm and 500 nm (i.e., TUV standard) is less than 20%. The demonstration of the low blue light as mentioned is better than the low blue light products using 460 nm blue light in the existing technologies. These existing low blue light products can only achieve less than 30% of TUV. The foregoing proportions show that these specific embodiments can simultaneously achieve the effects of wide color gamut and reducing the blue light that hurts the eyes.

Figure 7:
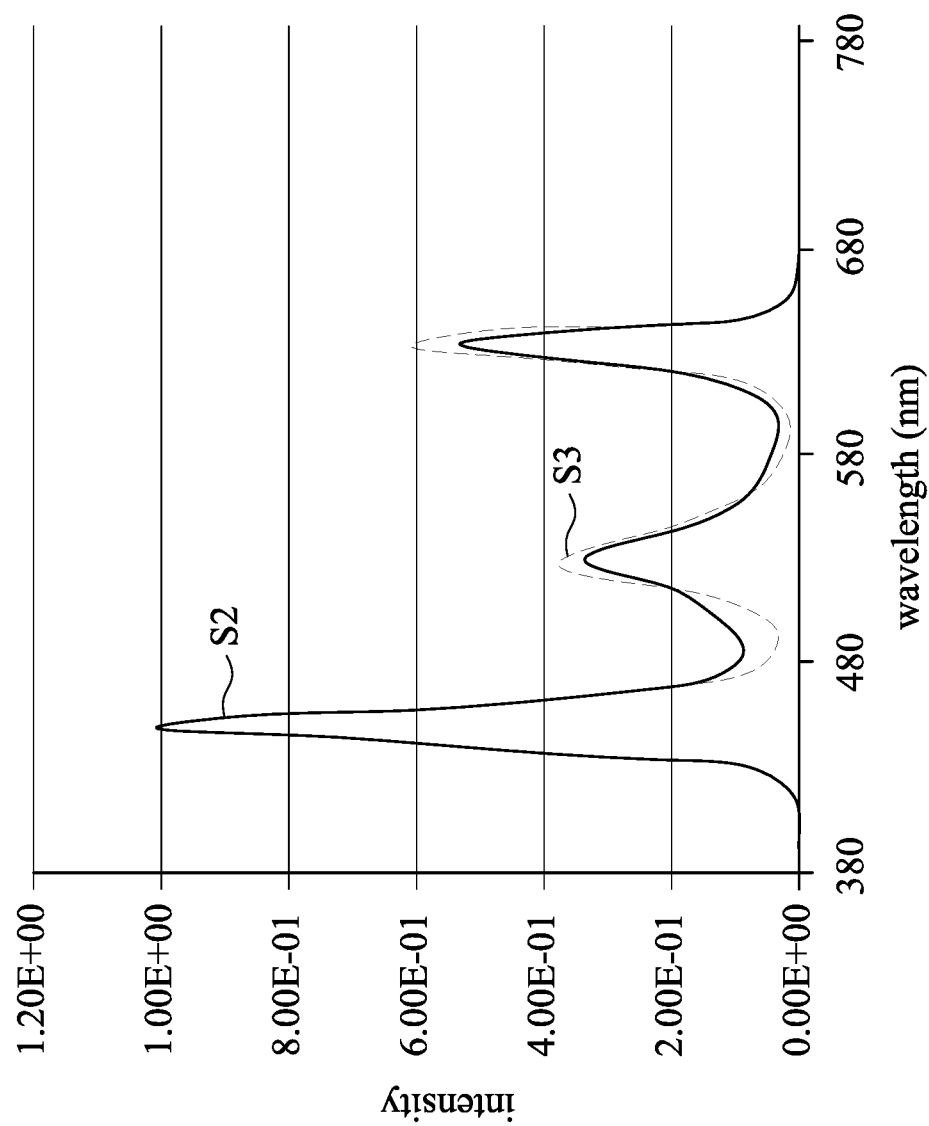
FIG. 7 is a comparative diagram of a spectral distribution between some embodiments of the present disclosure and existing low blue light products.

The aforementioned benefits of simultaneously achieving the wide color gamut and protecting the eyes from damage (also known as low blue light) can be explained and realized by a wavelength distribution in the embodiments of the present disclosure. Reference is made to FIG. 7. FIG. 7 is a comparative diagram of a spectral distribution between some embodiments of the present disclosure and the existing low blue light products. As shown in FIG. 7, the spectral distribution S3 has a higher light intensity in a range between about 470-520 nm than that of the spectral distribution S2. The rest of the spectral range without dotted lines represent portions where the spectral distribution S2 and the spectral distribution S3 are overlapped. Therefore, in the spectral distribution S3, a proportion of a spectral area in a wavelength range between 415 nm and 455 nm to a spectral area in a wavelength range between 400 nm and 500 nm is less than that of the spectral distribution S2, and a proportion of blue light that is harmful to the eyes can be effectively reduced, while maintaining performance of wide color gamut.

As described above, the embodiments of the present disclosure provide a low blue light backlight module. The low blue light backlight module includes a first light-emitting element, a second light-emitting element, a third light-emitting element and a fourth light-emitting element. The above light-emitting elements respectively emit red light, green light, low blue light and blue light. With a combination of the red light, the green light, the low blue light and the blue light, an output light of the low blue light backlight module can emit a white light having dual benefits of reducing a proportion of a blue light band that hurts the eyes and still maintaining wide color gamut.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A low blue light backlight module configured to emit a white light, comprising:
   a first light-emitting element configured to emit a first light having a peak emission wavelength of about 610-660 nm;
   a second light-emitting element configured to emit a second light having a peak emission wavelength of about 520-550 nm;
   a third light-emitting element configured to emit a third light having a peak emission wavelength of about 480-580 nm; and
   a fourth light-emitting element configured to emit a fourth light having a peak emission wavelength of about 445-470 nm, wherein the white light has an emission spectrum, and an area ratio of the emission spectrum under wavelength of 415-455 nm to the emission spectrum under wavelength of 400-500 nm is below 50%.

2. The low blue light backlight module of claim 1, wherein the first light-emitting element comprises a first light-emitting unit and a first wavelength conversion unit.

3. The low blue light backlight module of claim 1, wherein the first light-emitting element comprises a red LED chip.

4. The low blue light backlight module of claim 1, wherein the second light-emitting element comprises a second light-emitting unit and a second wavelength conversion unit.

5. The low blue light backlight module of claim 4, wherein the second light-emitting unit comprises a wavelength conversion material having a peak emission wavelength of 510-530 nm and a full width at half maximum (FWHM) of about 60-100 nm.

6. The low blue light backlight module of claim 1, wherein the second light-emitting element comprises a green LED chip.

7. The low blue light backlight module of claim 1, wherein the third light-emitting element comprises a third light-emitting unit and a third wavelength conversion unit.

8. The low blue light backlight module of claim 7, wherein the third wavelength conversion unit comprises a wavelength conversion material having a peak emission wavelength of 520-540 nm and a full width at half maximum (FWHM) of less than 50 nm.

9. The low blue light backlight module of claim 8, wherein the wavelength conversion material comprises green quantum dots.

10. The low blue light backlight module of claim 7, wherein the third wavelength conversion unit comprises a wavelength conversion material having a general formula (1) and satisfying a condition (2):

the general formula (1) is $M_m A_a C_c E_e:ES_x RE_y$, M is at least one element selected from a group consisting of Ca, Sr and Ba, wherein $2 \leq m \leq 3$; A is at least one element selected from a group consisting of Mg, Mn, Zn and Cd, wherein $0.01 \leq a \leq 1$; C is at least one element selected from a group consisting of Si, Ge, Ti and Hf, wherein $1 \leq c \leq 9$; E is at least one element selected from a group consisting of O, S and Se, wherein $5 \leq e \leq 7$; ES is at least one element selected from a group consisting of divalent Eu, Sm and Yb, wherein $0 \leq x \leq 3$; and RE is at least one element selected from a group consisting of trivalent Ce, Pr, Nd, Sm, Eu, Gd, Tb, Dy, Ho, Er and Tm, wherein $0 \leq y \leq 3$; and the condition (2) is m+x+y=3.

11. The low blue light backlight module of claim 10, wherein the third wavelength conversion unit further complying with a condition (3), wherein the condition (3) is that the third light has a maximum intensity, a difference between a maximum wavelength $\lambda_{1\ max}$ and a minimum wavelength $\lambda_{1\ min}$ of the third light is a' when an intensity of the third light is 50% of the maximum intensity, and another difference between a maximum wavelength $\lambda_{2\ max}$ and a minimum wavelength $\lambda_{2\ min}$ of the third light is b' when an intensity of the third light is 10% of the maximum intensity, wherein $2.5a' \leq b' \leq 7a'$.

12. The low blue light backlight module of claim 11, wherein 30 nm $\leq a' \leq$ 50 nm.

13. The low blue light backlight module of claim 1, wherein the fourth light-emitting element comprises a blue LED chip.

14. The low blue light backlight module of claim 1, wherein the first light-emitting element, the second light-emitting element, the third light-emitting element and the fourth light-emitting element are arranged in an array or in a row.

15. The low blue light backlight module of claim 1, further comprising an encapsulant between the first light-emitting element, the second light-emitting element, the third light-emitting element and the fourth light-emitting element.

16. The low blue light backlight module of claim 1, wherein an area ratio of the emission spectrum under wavelength of 415-455 nm to the emission spectrum under wavelength of 380-780 nm is below 30%.

17. The low blue light backlight module of claim 1, wherein the white light has an emission spectrum with a color gamut of at least 90% of NTSC RGB color space standard.

18. The low blue light backlight module of claim 1, further comprising a reflective structure, located between the first light-emitting element, the second light-emitting element, the third light-emitting element and the fourth light-emitting element.

* * * * *